(12) United States Patent
Park et al.

(10) Patent No.: US 8,896,337 B2
(45) Date of Patent: Nov. 25, 2014

(54) APPARATUS AND METHOD FOR MEASUREMENT OF RADIATION INTENSITY FOR TESTING RELIABILITY OF SOLAR CELL, AND METHOD FOR TESTING RELIABILITY OF SOLAR CELL

(75) Inventors: Sang-Hyun Park, Daejeon (KR); Jihye Gwak, Daejeon (KR); Sejin Ahn, Daejeon (KR); Kyung-Hoon Yoon, Daejeon (KR); Kee-Shik Shin, Daejeon (KR); SeoungKyu Ahn, Daejeon (KR); Ara Cho, Seoul (KR); Jae-Ho Yun, Daejeon (KR); Jun-Sik Cho, Daejeon (KR); Jin-Su Yoo, Seoul (KR); Joo-Hyung Park, Daejeon (KR); Young-Joo Eo, Daejeon (KR)

(73) Assignee: Korea Institute of Energy Research, Daejeon (KR)

( * ) Notice: Subject to any disclaimer, the term of this patent is extended or adjusted under 35 U.S.C. 154(b) by 356 days.

(21) Appl. No.: 13/566,259

(22) Filed: Aug. 3, 2012

(65) Prior Publication Data
US 2013/0076382 A1 Mar. 28, 2013

(30) Foreign Application Priority Data

Sep. 28, 2011 (KR) .................... 10-2011-0097984

(51) Int. Cl.
*G01R 31/26* (2014.01)
(52) U.S. Cl.
CPC ........ *G01R 31/2605* (2013.01); *G01R 31/2642* (2013.01)
USPC .................. 324/761.01; 324/750.03
(58) Field of Classification Search
CPC ............ H01L 31/02167; H01L 31/042; H01L 31/022425; H01L 31/02008; H01L 31/076; Y02E 10/546; Y02E 10/50; Y02E 10/40; G01R 31/2605; G01R 31/405; G01R 31/2642; B65G 2249/02; B65G 49/064; B65G 2249/04; B65G 49/068
USPC ............................ 324/761.01, 762.01–762.1
See application file for complete search history.

(56) References Cited

U.S. PATENT DOCUMENTS 6,441,896 B1 * 8/2002 Field ............................. 356/222
6,717,519 B2 * 4/2004 Kobayashi et al. ........... 340/635

FOREIGN PATENT DOCUMENTS

| KR | 1020090093318 | 9/2009 |
| KR | 1020100072457 | 7/2010 |
| KR | 1020100109126 | 10/2010 |
| KR | 1020110054651 | 5/2011 |

* cited by examiner

*Primary Examiner* — Tung X Nguyen
(74) *Attorney, Agent, or Firm* — Brian R. Morrison; Westman, Champlin & Koehler, P.A.

(57) ABSTRACT

An apparatus and method for measurement of radiation intensity for testing reliability of a solar cell, and a method for testing the reliability of the solar cell. The apparatus includes a first solar cell receiving a predetermined intensity of radiation or more to generate electricity, a second solar cell receiving a predetermined intensity of radiation or more to generate electricity; a temperature sensor sensing a temperature of the second solar cell; a cooler cooling the first solar cell; and a controller measuring the intensity of radiation applied to the first solar cell, and controlling the cooler to prevent the temperature of the first solar cell from increasing above a predetermined temperature depending on the temperature of the second solar cell sensed by the temperature sensor.

16 Claims, 3 Drawing Sheets

APPARATUS AND METHOD FOR MEASUREMENT OF RADIATION INTENSITY FOR TESTING RELIABILITY OF SOLAR CELL, AND METHOD FOR TESTING RELIABILITY OF SOLAR CELL

CROSS-REFERENCE TO RELATED APPLICATION

This application claims the benefit of Korean Patent Application No. 10-2011-0097984, filed on Sep. 28, 2011 in the Korean Intellectual Property Office, the disclosures of which are incorporated herein by reference.

BACKGROUND

1. Technical Field

The present invention relates to an apparatus and method for measurement of radiation intensity for testing reliability of a solar cell and a method for testing reliability of the solar cell, and more particularly, to actinography technology for a solar cell to test deterioration of the solar cell with regard to a high intensity of radiation of 10 to 20 suns and technology for testing reliability of a solar cell using the same.

2. Description of the Related Art

With increasing attention focused on solar cells, it becomes important to monitor the degree of deterioration of a solar cell in outdoor conditions. In experimentation for testing deterioration of the solar cell over time, it is necessary to perform rapid monitoring and simulation of the degree of deterioration of the solar cell in outdoor conditions over the course of 10 or 20 years.

However, there is a problem with directly using the intensity of radiation because typical outdoor solar radiation intensity is approximately equal to 1 sun ($kW/m^2$). Therefore, an intensity of radiation of 10 or 20 suns may be applied to a solar cell to test the degree of deterioration of the solar cell in a short time. Accordingly, there is a need for a solar cell capable of receiving high intensity of radiation in order to rapidly simulate deterioration of the solar cell over time, and it is necessary to measure the intensity of radiation received by the solar cell.

A conventional actinometer for testing deterioration of a solar cell is used with respect to an intensity of radiation of 1 sun. However, if this apparatus is directly applied to a solar cell for high intensity of radiation, it is difficult to measure the intensity of radiation due to linearity or limited quantity of electricity of the solar cell.

To overcome this problem, a filter may be used to reduce a high intensity of radiation of 10 or 20 suns collected in a solar cell. However, since linearity of the filter, transmission and reflection characteristics of the solar cell, and the like are not verified, the filter has low reliability. Moreover, the limit of the filter itself and errors occurring in the solar cell in measurement of the intensity of radiation having passed through the filter cause uncertainty in measurement of the intensity of radiation. Therefore, the filter cannot be accepted as a reliable alternative.

BRIEF SUMMARY

Therefore, the present invention is directed to solving the problems of the related art as described above, and an aspect of the present invention is to provide a stable and reliable apparatus and method for measuring high intensity of radiation applied to a solar cell to test the degree of deterioration of the solar cell.

In accordance with one aspect, the present invention provides an apparatus for measurement of radiation intensity for testing reliability of a solar cell, which includes: a first solar cell receiving a predetermined intensity of radiation or more to generate electricity; a second solar cell receiving a predetermined intensity of radiation or more to generate electricity; a temperature sensor sensing a temperature of the second solar cell; a cooler cooling the first solar cell; and a controller measuring the intensity of radiation applied to the first solar cell, and controlling the cooler to prevent the temperature of the first solar cell from increasing above a predetermined temperature depending on the temperature of the second solar cell sensed by the temperature sensor.

The apparatus may further include: a cover covering the first solar cell not to be exposed to an outside, and a motor operating the cover. Here, the controller controls the motor such that the first solar cell receives light.

The apparatus may further include: a cover covering the first solar cell not to be exposed to an outside, and a motor moving the first solar cell. Here, the controller controls the motor such that the first solar cell receives light.

The cooler may be placed under the first solar cell.

The apparatus may further include: a temperature sensing unit which senses the temperature of the first solar cell. Here, the controller controls a temperature of the cooler depending on the temperature of the first solar cell sensed by the temperature sensing unit.

The first solar cell and the second solar cell are capable of receiving an intensity of radiation of 10 suns ($kW/m^2$) or more.

In accordance with another aspect, the present invention provides a method for measurement of radiation intensity for testing reliability of a solar cell, which includes: sensing a temperature of one of at least two solar cells which receives light in a reliability testing apparatus, with the other solar cell covered not to receive light; exposing the other solar cell to receive light; controlling a temperature of the other solar cell exposed to receive light according to the sensed temperature of the one solar cell; and measuring the intensity of radiation applied to the other solar cell.

The exposing the other solar cell may include operating a cover to expose the other solar cell to receive light.

The exposing the other solar cell may include moving the other solar cell to be exposed to receive light.

The method may further include: sensing a temperature of the other solar cell exposed to receive light.

The at least two solar cells are capable of receiving an intensity of radiation of 10 suns ($kW/m^2$) or more In accordance with a further aspect, the present invention provides a method for testing reliability of a solar cell, which includes: measuring the intensity of radiation of a solar cell by a method for measurement of radiation intensity for testing reliability of the solar cell; and testing a degree of deterioration of the solar cell according to the measured intensity of radiation. The method for measurement of radiation intensity includes: sensing a temperature of one of at least two solar cells which receive light in a reliability testing apparatus, with the other solar cell covered not to receive light; exposing the other solar cell to receive light; controlling a temperature of the other solar cell exposed to receive light according to the sensed temperature of the one solar cell; and measuring the intensity of radiation applied to the other solar cell.

The exposing the other solar cell may include operating a cover to expose the other solar cell to receive light.

The exposing the other solar cell may include moving the other solar cell to be exposed to receive light.

The method for measurement of radiation intensity may further include: sensing a temperature of the other solar cell exposed to receive light.

The other solar cell is capable of receiving an intensity of radiation of 10 suns ($kW/m^2$) or more.

As such, in technology for measuring the intensity of radiation to test reliability of a solar cell according to one embodiment, a high intensity of radiation of 10 or 20 suns may be directly applied to the solar cell and measured, thereby enabling stable and reliable measurement of the radiation intensity while enhancing reliability in reliability testing of the solar cell. Further, since the solar cell capable of receiving high intensity of radiation may be directly used, linearity of the solar cell may be maintained with respect to high intensity of radiation, thereby enabling highly reliable testing.

Further, it is possible to prevent the solar cell from rapidly increasing in temperature as the solar cell is suddenly exposed to high intensity of radiation, thereby minimizing overstrain of the solar cell or minimizing situations causing abnormal measurement.

BRIEF DESCRIPTION OF THE DRAWINGS

The above and other aspects, features, and advantages of the present invention will become apparent from the detailed description of the following embodiments in conjunction with the accompanying drawings, in which.

DETAILED DESCRIPTION

Embodiments of the present invention will now be described in detail with reference to the accompanying drawings, while well-known technical portions will be omitted or abstracted for clarity of description.

Figure 1:
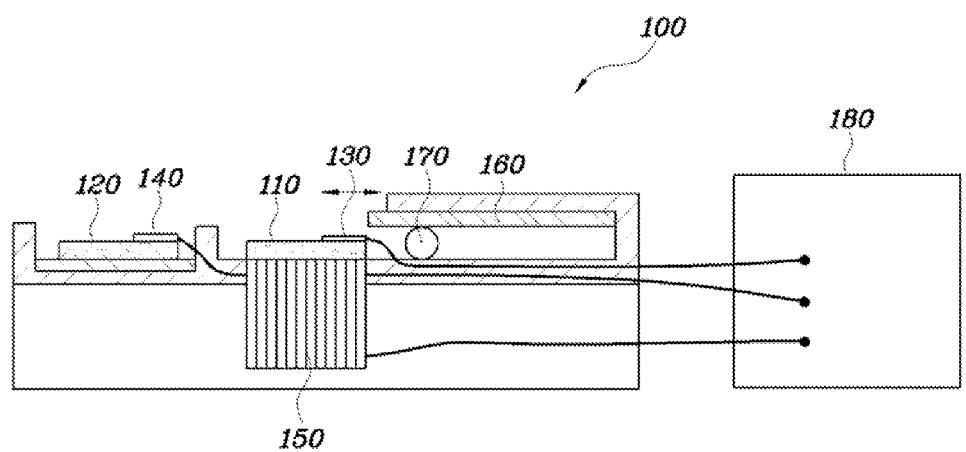
FIG. 1 is a side view of an apparatus for measurement of radiation intensity for testing reliability of a solar cell according to one embodiment of the present invention.
Figure 2:
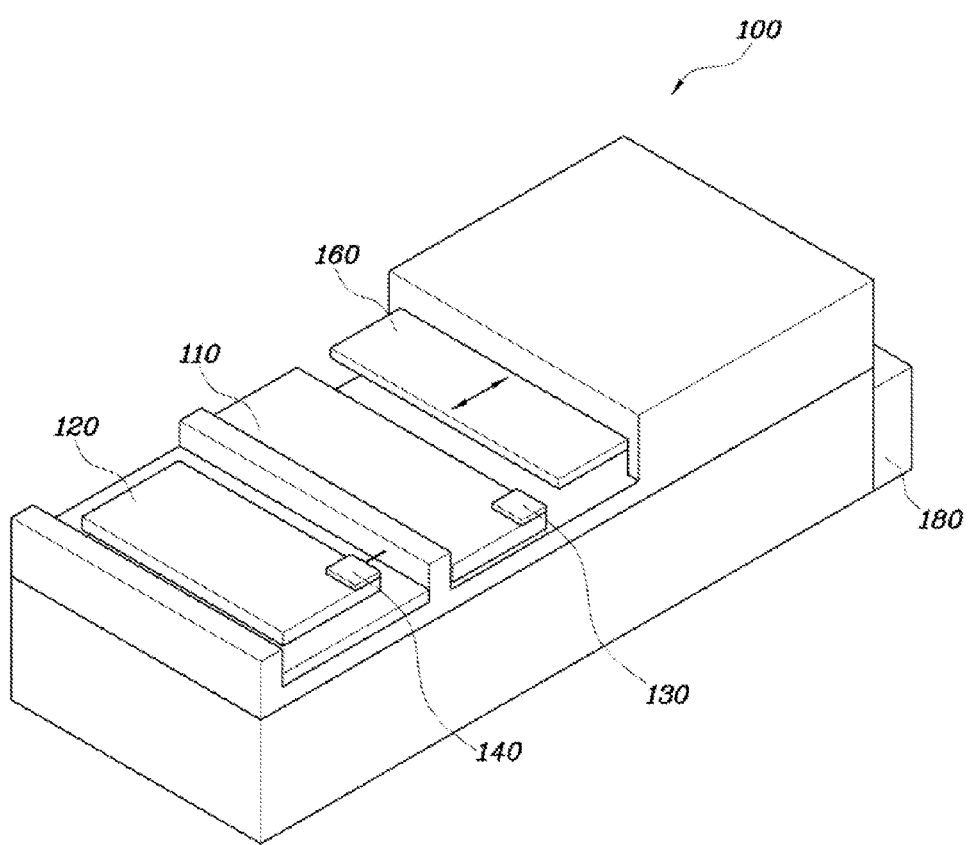
FIG. 2 is a perspective view of the apparatus for measurement of radiation intensity for testing reliability of a solar cell according to the embodiment of the present invention.

Referring to FIGS. 1 and 2, an apparatus for measurement of radiation intensity 100 for testing reliability of a solar cell according to one embodiment includes a first solar cell 110, a second solar cell 120, a first temperature sensor 130, a second temperature sensor 140, a cooler 150, a cover 160, a motor 170, and a controller 180.

The first and second solar cells 110, 120 may receive a high intensity of radiation of 10 or 20 suns to generate electricity and are arranged in parallel to each other.

The first and second temperature sensors 130, 140 are disposed in the first and second solar cells 110, 120 to measure the temperature of the first and second solar cells 110, 120, respectively.

The cooler 150 is placed under the first solar cell 110 to lower the temperature of the first solar cell 110. The cooler 150 receives electric power from outside and adjusts the temperature of the first solar cell corresponding to the electric power applied thereto.

The cover 160 is placed above the first solar cell 110 to cover the first solar cell 110 such that the first solar cell 110 is not exposed to the outside. Further, the cover 160 is movable to expose the first solar cell 110 to the outside. That is, the cover 160 slides to cover or expose the first solar cell 110, as shown in FIG. 2. The cover 160 may have a various shape as needed.

The motor 170 operates the cover 160 under control of the controller 180. In this embodiment, the motor 170 operates the cover 160 to slide, without being limited thereto. Alternatively, the motor 170 may move the first solar cell 110 to be placed below the cover 160.

The controller 180 measures the intensity of radiation applied to the first solar cell 110. Further, the controller 180 receives data of temperatures sensed by the first and second temperature sensors 130, 140, and applies electric power to the cooler 150 and the motor 170. The controller 180 receives the temperature sensed by the second temperature sensor 140 and controls electric current applied to the cooler 150 according to the sensed temperature. Therefore, it is possible to prevent the temperature of the first solar cell 110 from being suddenly increased when the first solar cell 110 is suddenly exposed to high intensity of radiation.

Further, the controller 180 may control the cover 160 to move by applying electric power to the motor 170. That is, when the apparatus for measurement of radiation intensity 100 according to the embodiment is first exposed to light, the second solar cell 120 is exposed to the light, but the first solar cell 110 is not exposed to the light while being covered with the cover 160. Then, the temperature of the second solar cell 120 increases by the light, and the controller 180 adjusts electric current applied to the cooler 150 corresponding to the temperature of the second solar cell 120 sensed by the second temperature sensor 140. Next, the controller 180 applies electric power to the motor 170 and opens the cover 160 to expose the first solar cell 110 to the light.

The first solar cell 110 exposed to the light may be prevented from increasing in temperature by the cooler 150 even though the first solar cell 110 suddenly receives high intensity of radiation when generating electricity based on the high intensity of radiation.

Further, the controller 180 continuously senses the temperature of the first solar cell 110 through the first temperature sensor 130. This operation maintains the temperature of the first solar cell 110 which receives the high intensity of radiation.

Figure 3:
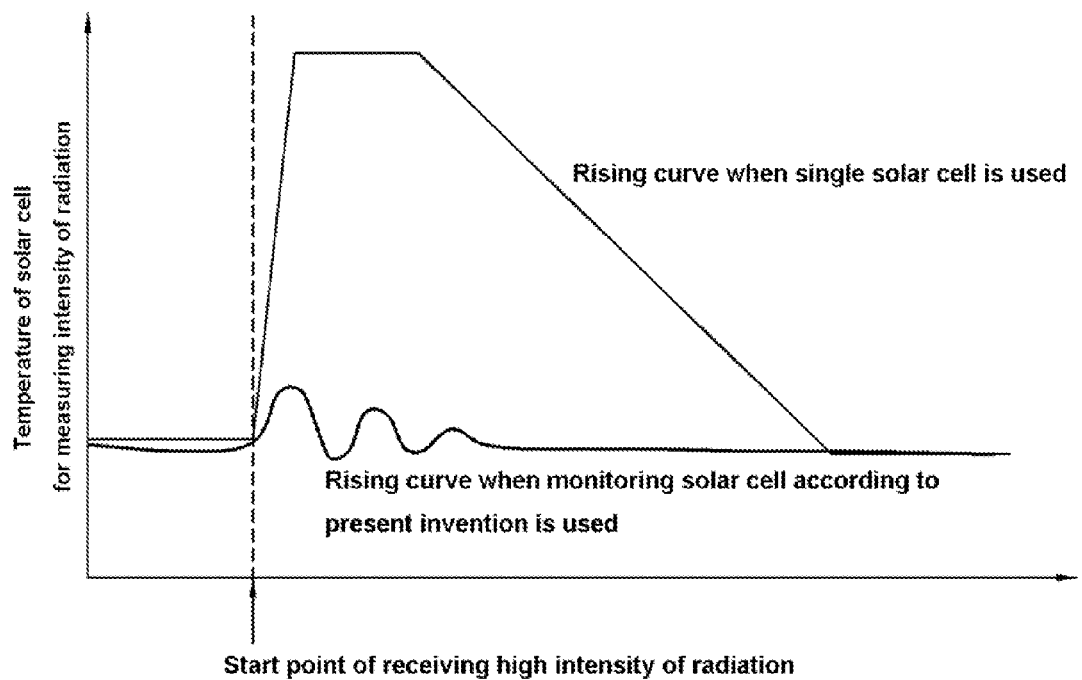
FIG. 3 is a graph depicting a comparison result of temperatures measured using an apparatus for measurement of radiation intensity according to one embodiment of the present invention and a conventional actinometer.

Referring to FIG. 3, the first solar cell 110 varies in temperature as follows.

Before a time point of receiving high intensity of radiation, electric power is applied to the cooler 150 depending on the temperature of the second solar cell 120 sensed by the second temperature sensor 140. After the time point of receiving high intensity of radiation, electric power applied to the cooler 150 is adjusted depending on the temperature of the first solar cell 110 sensed by the first temperature sensor 130. As such, the first solar cell 110 is maintained at a constant temperature by maintaining the temperature of the cooler 150.

In the case of using a single solar cell, however, the solar cell undergoes sudden increase in temperature when receiving high intensity of radiation, as shown in FIG. 3, and the cooler operates after the sudden temperature increase of the solar cell. Thus, the solar cell remains at high temperature for a certain period of time and is then lowered in temperature by the cooler to maintain the temperature of the solar cell. Thus, when the temperature of the solar cell rapidly increases, not only is the solar cell overstrained, but also it takes considerable time to measure the degree of deterioration of the solar cell at a constant temperature since the temperature of the solar cell must be adjusted to a desired temperature.

On the other hand, the present invention includes the first and second solar cells 110, 120, whereby the temperature of the first solar cell 110 may be previously adjusted, thereby preventing the temperature of the first solar cell 110 from suddenly increasing. In addition, variation in temperature of the first solar cell 110 is not severe. Therefore, it is possible to more quickly measure the intensity of radiation applied to the first solar cell 110, and to prevent the first solar cell 110 from suddenly increasing in temperature, thereby allowing more accurate measurement of the solar radiation applied to the first solar cell 110.

Furthermore, the solar radiation measured by the foregoing method is used in testing reliability of the solar cell, thereby improving test reliability and stability.

Although some embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

What is claimed is:

1. An apparatus for measurement of radiation intensity for testing reliability of a solar cell, comprising:
    a first solar cell receiving a predetermined intensity of radiation or more to generate electricity;
    a second solar cell receiving a predetermined intensity of radiation or more to generate electricity;
    a temperature sensor sensing a temperature of the second solar cell;
    a cooler cooling the first solar cell; and
    a controller measuring the intensity of radiation applied to the first solar cell, and controlling the cooler to prevent the temperature of the first solar cell from increasing above a predetermined temperature depending on the temperature of the second solar cell sensed by the temperature sensor.

2. The apparatus according to claim 1, further comprising:
    a cover covering the first solar cell not to be exposed to an outside; and
    a motor operating the cover,
    the controller controlling the motor such that the first solar cell receives light.

3. The apparatus according to claim 1, further comprising:
    a cover covering the first solar cell not to be exposed to an outside; and
    a motor moving the first solar cell,
    the controller controlling the motor such that the first solar cell receives light.

4. The apparatus according to claim 1, wherein the cooler is placed under the first solar cell.

5. The apparatus according to claim 1, further comprising:
    a temperature sensing unit which senses the temperature of the first solar cell,
    the controller controlling a temperature of the cooler depending on the temperature of the first solar cell sensed by the temperature sensing unit.

6. The apparatus according to claim 1, wherein the first solar cell and the second solar cell are capable of receiving an intensity of radiation of 10 suns ($kW/m^2$) or more.

7. A method for measurement of radiation intensity for testing reliability of a solar cell, comprising:
    sensing a temperature of one of at least two solar cells which receives light in a reliability testing apparatus, with the other solar cell covered not to receive light;
    exposing the other solar cell to receive light;
    controlling a temperature of the other solar cell exposed to receive light according to the sensed temperature of the one solar cell; and
    measuring intensity of radiation applied to the other solar cell.

8. The method according to claim 7, wherein the exposing the other solar cell comprises operating a cover to expose the other solar cell to receive light.

9. The method according to claim 7, wherein the exposing the other solar cell comprises moving the other solar cell to be exposed to receive light.

10. The method according to claim 7, further comprising: sensing a temperature of the other solar cell exposed to receive light.

11. The method according to claim 7, wherein the at least two solar cells are capable of receiving an intensity of radiation of 10 suns ($kW/m^2$) or more.

12. A method for testing reliability of a solar cell, comprising:
    measuring intensity of radiation of a solar cell by a method for measurement of radiation intensity for testing reliability of the solar cell; and
    testing a degree of deterioration of the solar cell according to the measured intensity of radiation,
    the method for measurement of radiation intensity comprising:
        sensing a temperature of one of at least two solar cells which receive light in a reliability testing apparatus, with the other solar cell covered not to receive light;
        exposing the other solar cell to receive light;
        controlling a temperature of the other solar cell exposed to receive light according to the sensed temperature of the one solar cell; and
        measuring the intensity of radiation applied to the other solar cell.

13. The method according to claim 12, wherein the exposing the other solar cell comprises operating a cover to expose the other solar cell to receive light.

14. The method according to claim 12, wherein the exposing the other solar cell comprises moving the other solar cell to be exposed to receive light.

15. The method according to claim 12, wherein the method for measurement of radiation intensity further comprises: sensing a temperature of the other solar cell exposed to receive light.

16. The method according to claim 12, wherein the at least two solar cells are capable of receiving an intensity of radiation of 10 suns ($kW/m^2$) or more.

* * * * *